(12) United States Patent
Ohtani et al.

(10) Patent No.: US 7,297,599 B2
(45) Date of Patent: Nov. 20, 2007

(54) METHOD OF FABRICATING SEMICONDUCTOR DEVICE

(75) Inventors: Norio Ohtani, Kanagawa (JP); Hirohisa Iizuka, Mie (JP); Hiroaki Hazama, Mie (JP); Kazuhito Narita, Mie (JP); Eiji Kamiya, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 246 days.

(21) Appl. No.: 11/219,752

(22) Filed: Sep. 7, 2005

(65) Prior Publication Data

US 2006/0051908 A1    Mar. 9, 2006

(30) Foreign Application Priority Data

Sep. 7, 2004    (JP) .............................. 2004-259534

(51) Int. Cl.
  *H01L 21/8234*    (2006.01)
(52) U.S. Cl. ...................... 438/275; 438/258; 438/443; 257/E21.68
(58) Field of Classification Search ........ 438/257–267, 438/275–278, 400–454; 257/E21.68, E21.681
  See application file for complete search history.

(56) References Cited

U.S. PATENT DOCUMENTS

2005/0048689 A1*    3/2005    Mabuchi ...................... 438/59

FOREIGN PATENT DOCUMENTS

JP    2002-57230    2/2002

\* cited by examiner

*Primary Examiner*—H. Jey Tsai
(74) *Attorney, Agent, or Firm*—Oblon, Spivak, McClelland, Maier & Neustadt, P.C.

(57) ABSTRACT

A method of fabricating a semiconductor device includes forming on a semiconductor substrate a gate electrode with a gate insulating film being interposed between the substrate and the electrode, forming an insulating film for element isolation protruding from a surface of the semiconductor substrate, forming an oxide film on the surface of the semiconductor substrate with the gate electrode and the element isolation insulating film having been formed, removing the oxide film in a region in which a self-aligned contact hole is to be formed while using a resist pattern for removing the oxide film formed in a region in which the self-aligned contact hole is formed, and etching a part of the element isolation insulating film protruding from the surface of the semiconductor substrate so that said part is substantially on a level with the surface of the semiconductor substrate, while using the resist pattern for removing the oxide film formed in the region in which the self-aligned contact hole is formed.

3 Claims, 10 Drawing Sheets

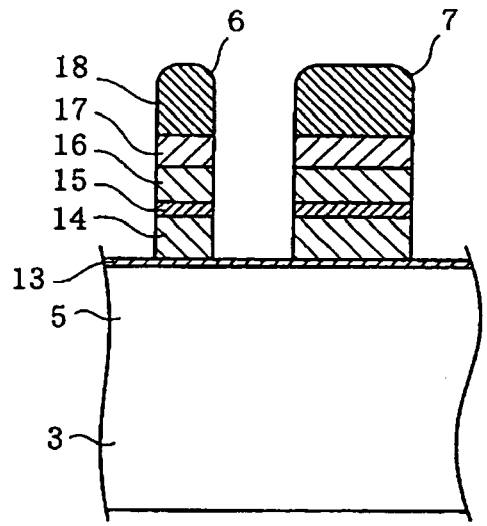
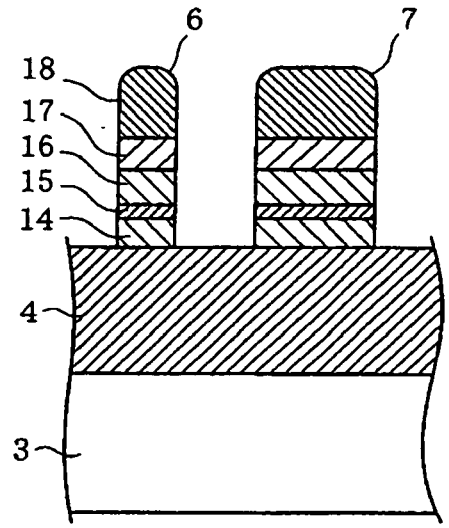
FIG. 3A  FIG. 3B
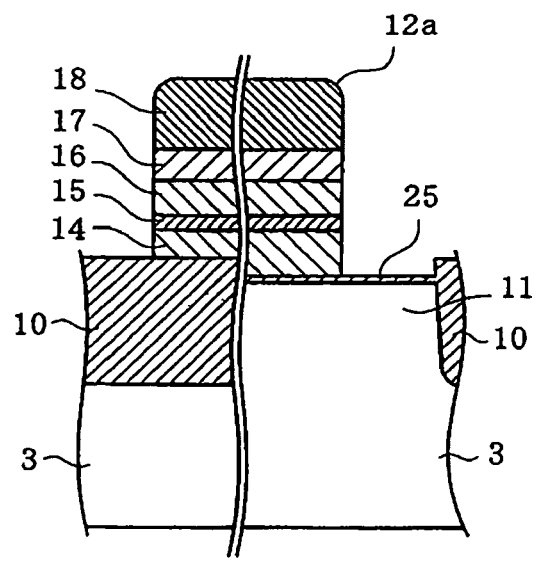
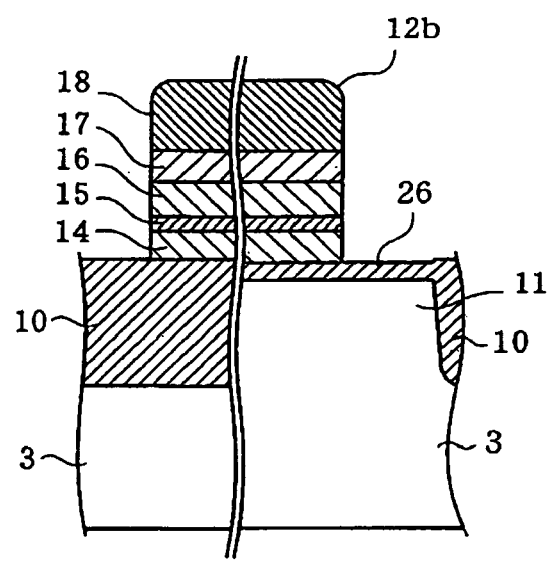
FIG. 3C  FIG. 3D

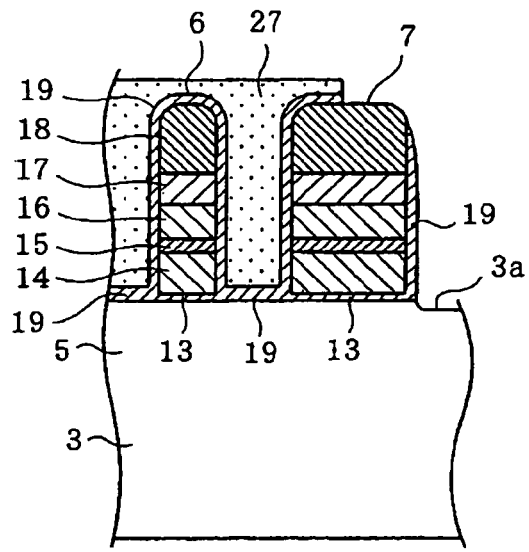
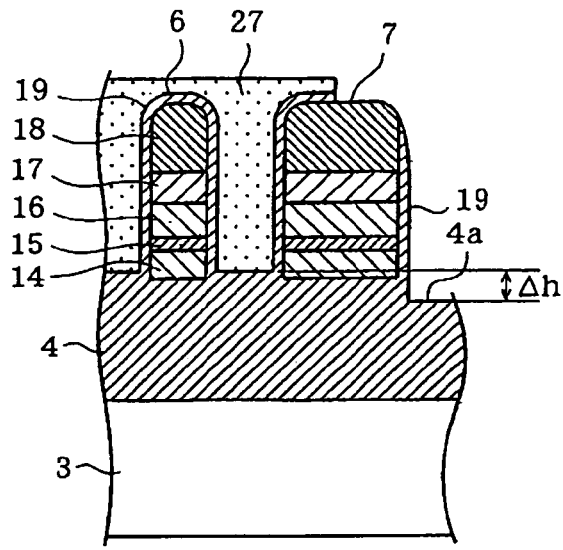
FIG. 4A  FIG. 4B
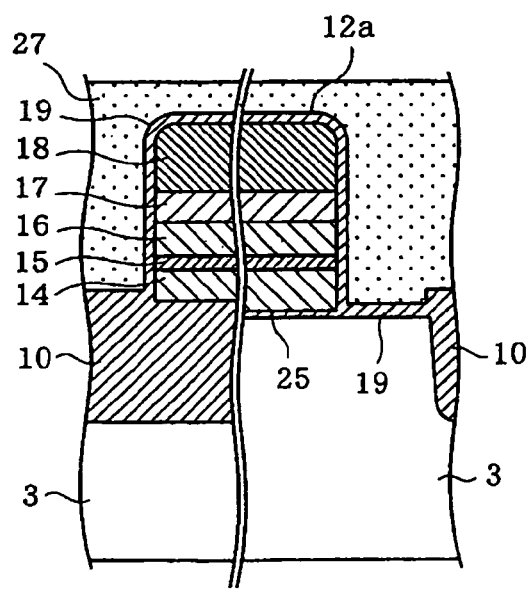
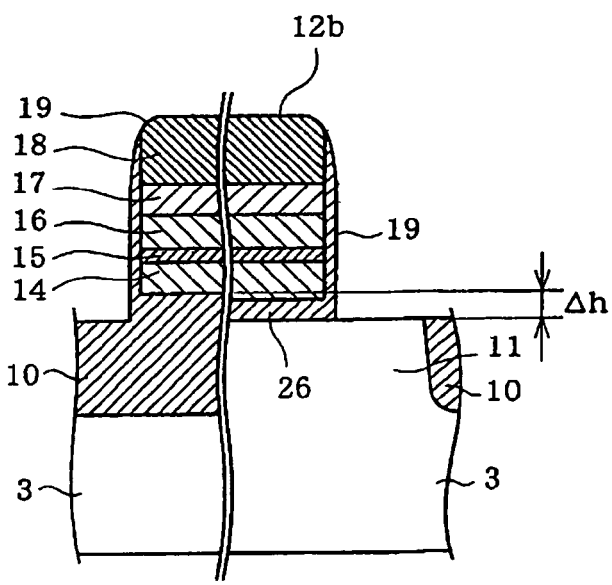
FIG. 4C  FIG. 4D

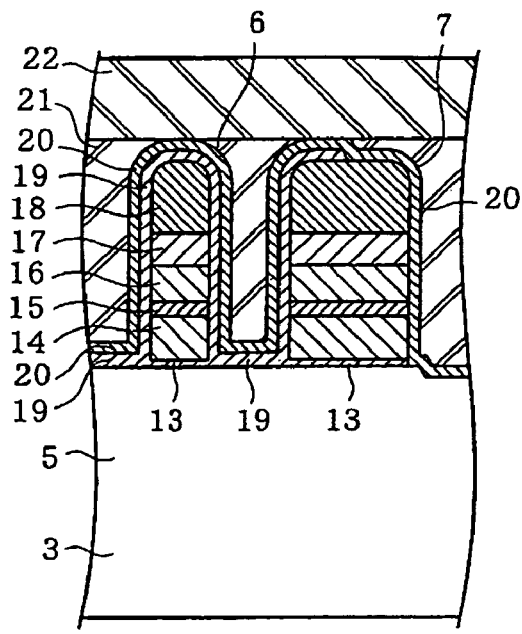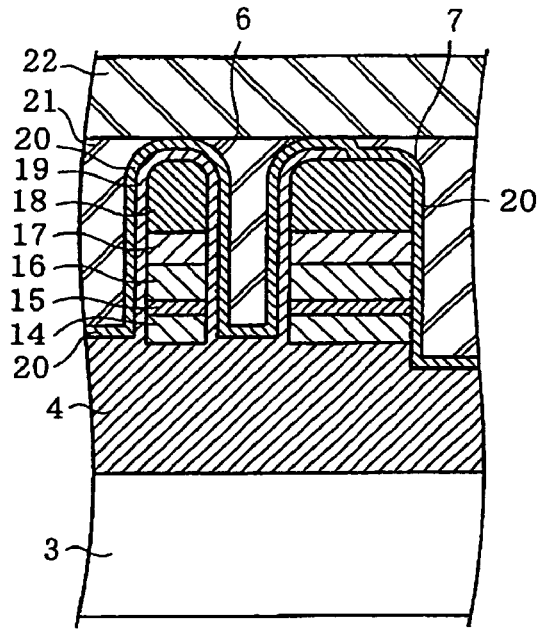
FIG. 7A    FIG. 7B
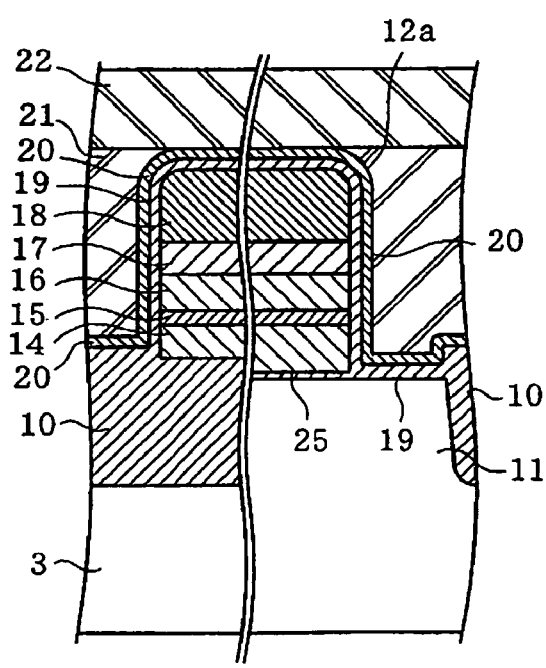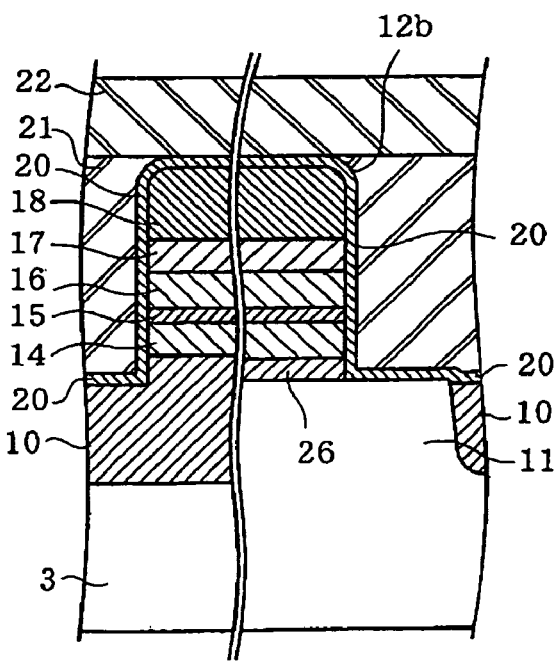
FIG. 7C    FIG. 7D

METHOD OF FABRICATING SEMICONDUCTOR DEVICE

CROSS-REFERENCE TO RELATED APPLICATIONS

This application is based upon and claims the benefit of priority from the prior Japanese Patent Application No. 2004-259534, filed on Sep. 7, 2004, the entire contents of which are incorporated herein by reference.

BACKGROUND OF THE INVENTION

1. Field of the Invention

The present invention relates to a method of fabricating a semiconductor device provided with transistors having a plurality of gate insulating films with different film thicknesses.

2. Description of the Related Art

Semiconductor devices such as flash memories comprise a memory cell region in which a number of memory cell transistors are formed and a peripheral circuit region including high breakdown voltage transistors. The high breakdown voltage transistors are formed with gate oxide films with film thicknesses differing from each other according to different gate breakdown voltages respectively. The transistors are isolated from each other by shallow trench isolation (STI). The above-described configuration is dominant. Furthermore, a self-aligned contact structure is employed for improvement in high integration in a process of forming contact holes.

One type of semiconductor device has a structure that oxide films are formed on sidewalls of gate electrodes for improvement in the reliability of the gate electrodes. A silicon nitride film is used as a stopper when contact holes are formed by self-aligned contact in this type of semiconductor device. In this case, however, an inconvenience occurs in relation to the use of silicon nitride film as the stopper. In view of the inconvenience, the prior art has employed a method as disclosed in JP-A-2002-57230. In the disclosed method, an oxide film in the contact hole forming region is previously removed and then, a silicon nitride film is formed.

On the other hand, in the configuration employing the aforesaid self-aligned contact, another problem arises which results from a difference in height between an STI structure as an element isolation insulating film and a silicon substrate. More specifically, when a silicon oxide film and a silicon nitride film are formed after formation of a gate electrode, the silicon nitride film remains in a stepped portion of the STI structure as if the film served as a spacer. Accordingly, a contact area of the gate electrode with the silicon substrate is reduced, which results in an increase in the contact resistance. In order that this inconvenience may be overcome, an etchback process is carried out for the silicon oxide film buried in a groove of the STI structure before formation of the silicon nitride film serving as a stopper, so that the difference in height is reduced between the surface of the silicon substrate and the STI structure.

However, when the above-described fabrication process is executed, a surface layer of the silicon substrate in a region around the gate electrode is etched. The etched surface layer of the silicon substrate is a factor reducing a short channel characteristic as an operating characteristic of the memory cell. As a countermeasure, for example, before a thick gate oxide film and STI are etched so as to reach the level of the silicon substrate surface, a portion where a thin gate oxide film is formed, such as a memory cell transistor or low breakdown voltage transistors, are suggested to be masked by a photoresist or the like so that the silicon substrate is prevented from being etched. However, since this method necessitates a photolithography to be added, the number of steps in the fabrication process is increased and accordingly, the costs are increased. Thus, a fabrication method that does not necessitate addition of the photolithography process has been desired.

BRIEF SUMMARY OF THE INVENTION

Therefore, an object of the present invention is to provide a method of fabricating a semiconductor device in which the silicon substrate can be prevented from being cut away without addition of a new photolithography process when the element isolation insulating film of the self aligned contact hole, whereupon the short-channel effects can be prevented from being degraded.

The present invention provides a method of fabricating a semiconductor device, comprising forming on a semiconductor substrate a gate electrode with a gate insulating film being interposed therebetween, forming an insulating film for element isolation protruding from a surface of the semiconductor substrate, forming an oxide film on the surface of the semiconductor substrate with the gate electrode and the element isolation insulating film having been formed, removing the oxide film in a region in which a self-aligned contact hole is to be formed while using a resist pattern for removing the oxide film formed in a region in which the self-aligned contact hole is formed, and etching a part of the element isolation insulating film protruding from the surface of the semiconductor substrate so that said part is substantially on a level with the surface of the semiconductor substrate, while using the resist pattern for removing the oxide film formed in the region in which the self-aligned contact hole is formed.

BRIEF DESCRIPTION OF THE DRAWINGS

Other objects, features and advantages of the present invention will become clear upon review of the following detailed description of the invention, with reference to the accompanying drawings, in which:

FIGS. 3A to 3D are views similar to FIGS. 1A to 1D, showing a middle stage of a fabrication process, respectively;

FIGS. 4A to 4D are also views similar to FIGS. 1A to 1D, showing another middle stage of the fabrication process, respectively;

FIGS. 7A to 7D are also views similar to FIGS. 1A to 1D, showing further another middle stage of a fabrication process, respectively;

DETAILED DESCRIPTION OF THE INVENTION

Figure 1A:
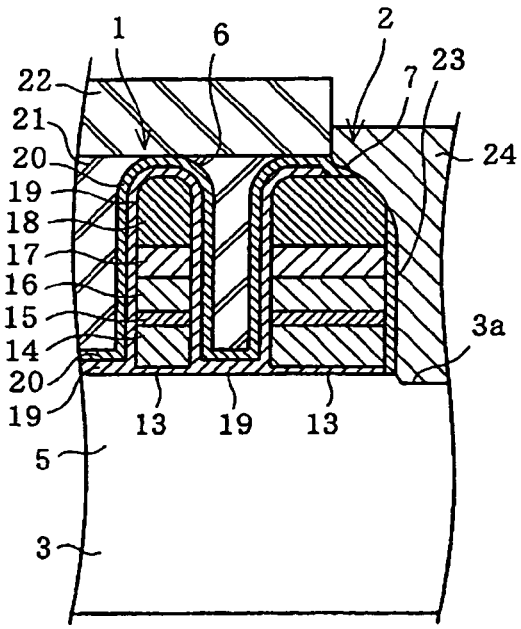
FIGS. 1A to 1D are schematic sectional views of a semiconductor device of a first embodiment of the invention.
Figure 1B:
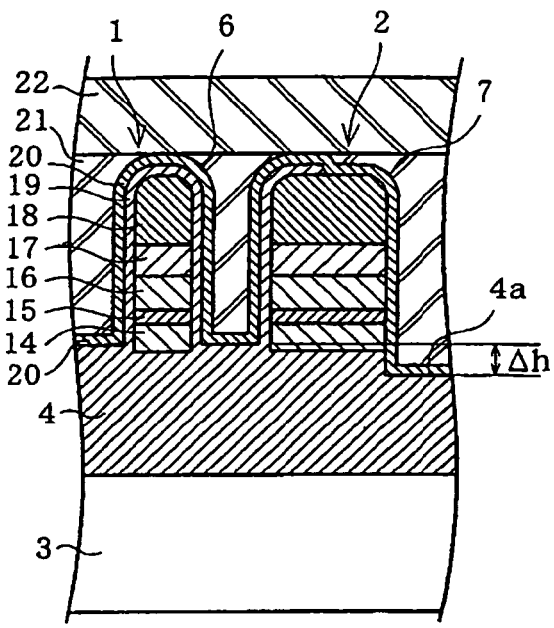

A first embodiment of the present invention will be described with reference to FIGS. 1A to 8D. The invention is applied to a flash memory in the first embodiment. The flash memory comprises a memory cell region as shown in FIG. 2A and a peripheral circuit region as shown in FIG. 2B. The memory cell region includes a number of memory cell transistors 1 for storage and a number of selective gate transistors 2 for read/write control. FIGS. 1A to 1D show sections of the flash memory in a stage where a bit line contact hole has been formed between the selective gate transistors 2, a polycrystalline silicon layer has been buried and an etchback process has been carried out.

Referring to FIGS. 2A and 2B, a trench is formed in a surface of a silicon substrate 3 (see FIGS. 1A-1D) serving as a semiconductor substrate. An insulating film is buried in the trench so that a shallow trench isolation (STI) 4 serving as an element isolation insulating film is provided. A surface layer of the silicon substrate 3 isolated by the STI 4 forms an active area 5. Thus, the STI 4 serves as an element isolating region. The active area 5 includes a gate electrode 6 formed in an upper area thereof so as to be perpendicular to the active area 5. The memory cell transistor 1 is formed in the gate electrode 6. A selective gate transistor 2 is formed in a gate electrode 7 wider than the gate electrode 6. FIGS. 1A and 1B are sectional views taken along line 1A-1A and line 1B-1B in FIG. 2A respectively.

A peripheral circuit region for drive control is disposed so as to surround the memory cell region. The peripheral circuit region is formed with a low-voltage drive transistor 8 and a high-voltage drive transistor 9. An STI 10 is formed on the silicon substrate 3 so as to serve as an element isolation insulating film. An active area 11 is isolated by the STI 10. The active area 11 is wider than the active area 5 of the memory cell region. Wider gate electrodes 12a and 12b are formed so as to be perpendicular to the active area 11. The gate electrodes 12a and 12b constitute the transistors 8 and 9 respectively.

Figure 1C:
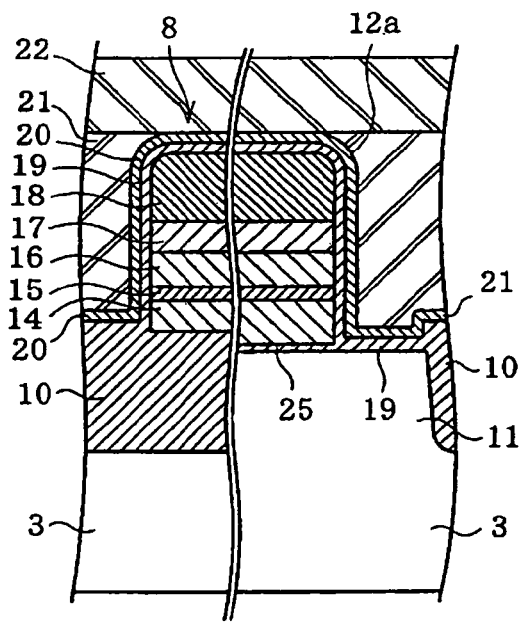
Figure 1D:
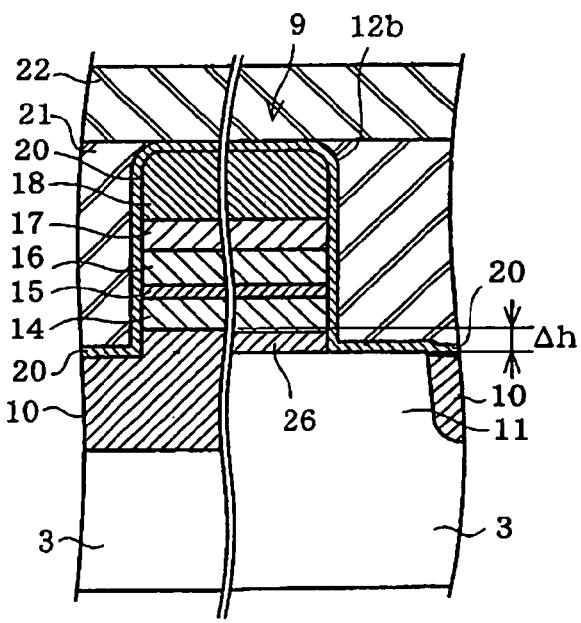
Figure 2A:
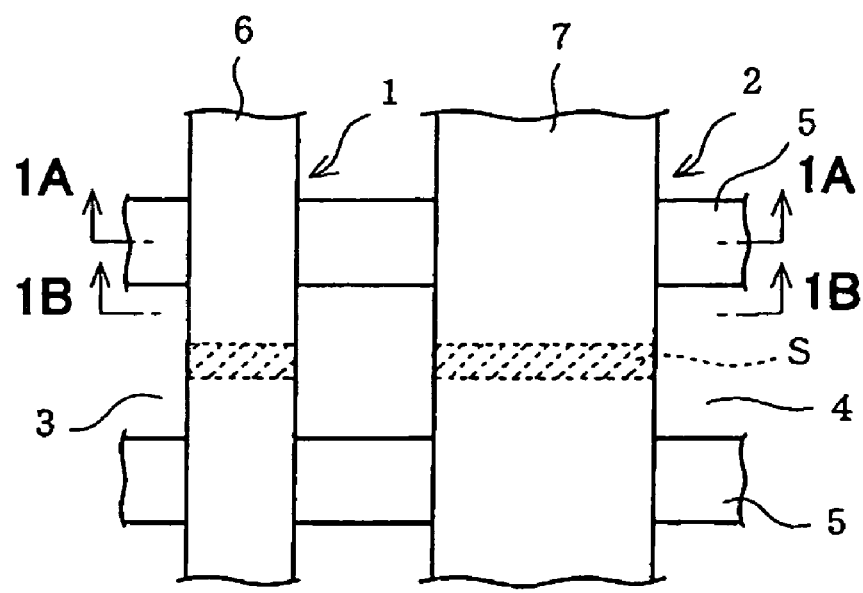
FIGS. 2A and 2B are plan views of the semiconductor device, showing active regions corresponding to a memory cell region and a peripheral circuit region, and an arrangement of gate electrodes.
Figure 2B:
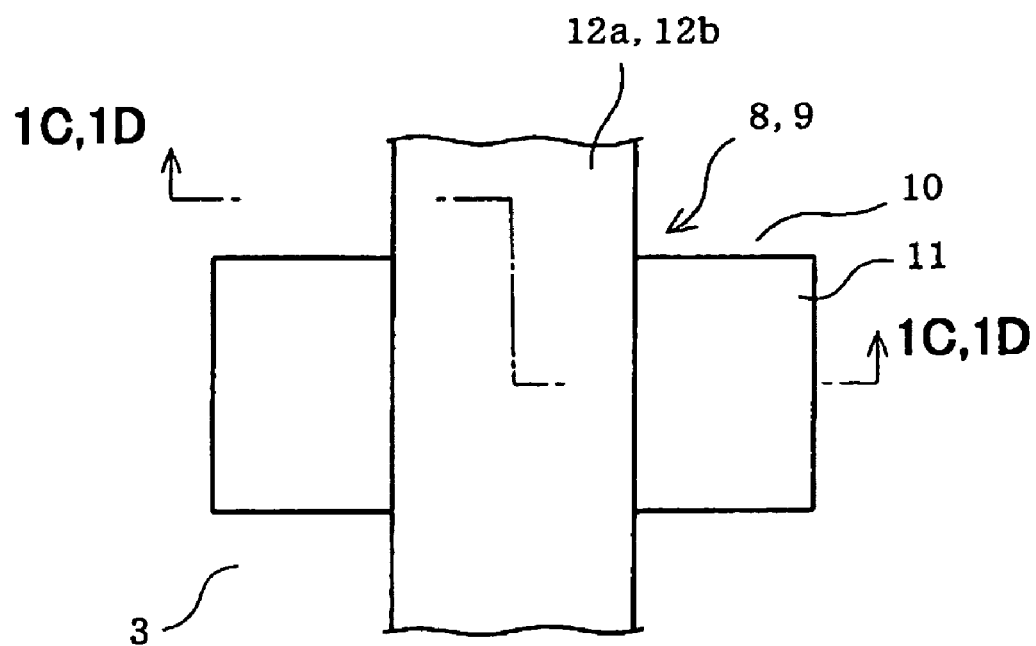
Figure 5A:
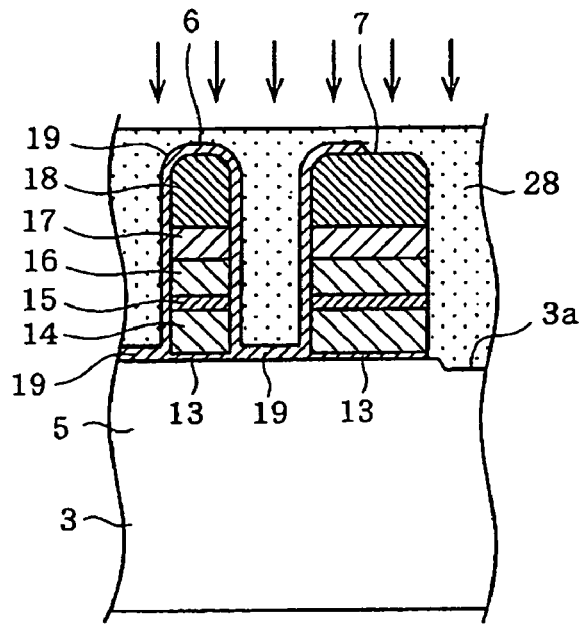
FIGS. 5A to 5D are views similar to FIGS. 1A to 1D, showing further another middle stage of the fabrication process, respectively.
Figure 5B:
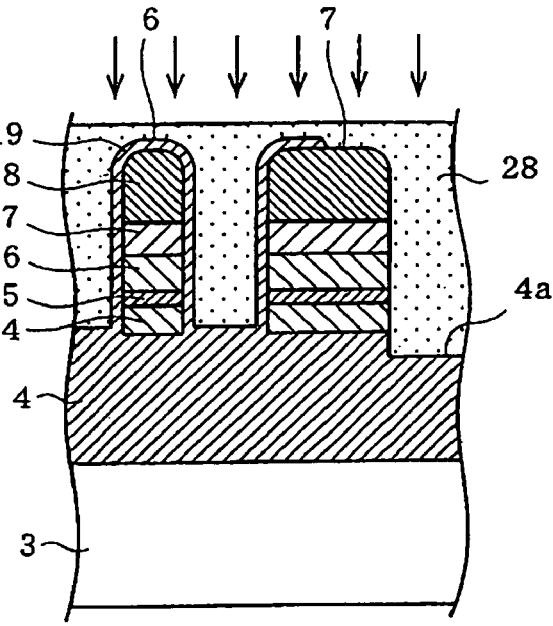
Figure 5C:
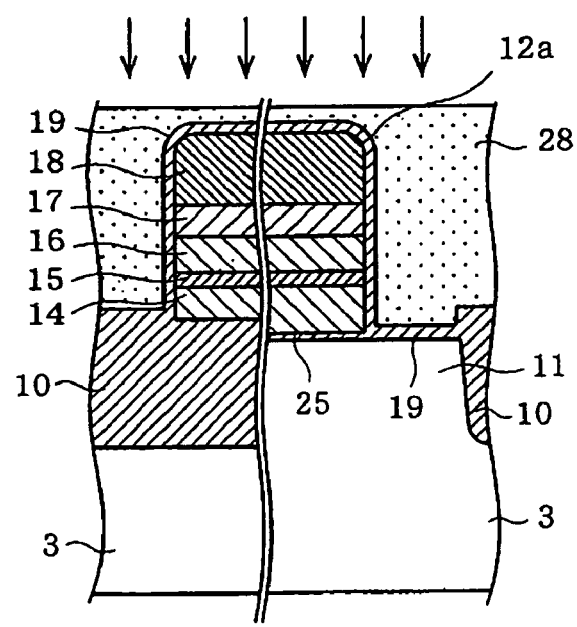
Figure 5D:
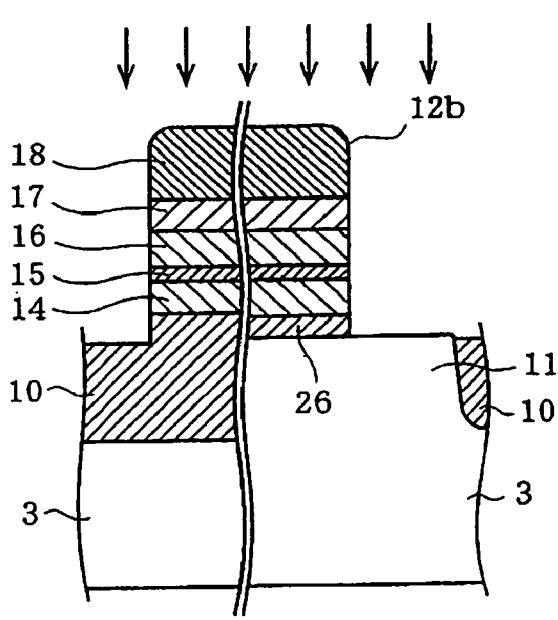
Figure 6A:
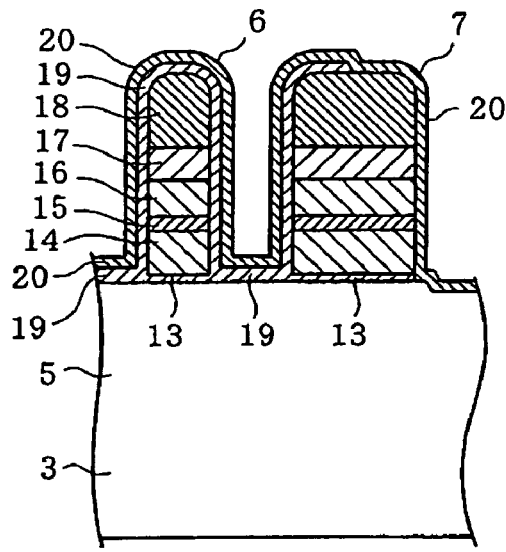
FIGS. 6A to 6D are also views similar to FIGS. 1A to 1D, showing further another middle stage of a fabrication process, respectively.
Figure 6B:
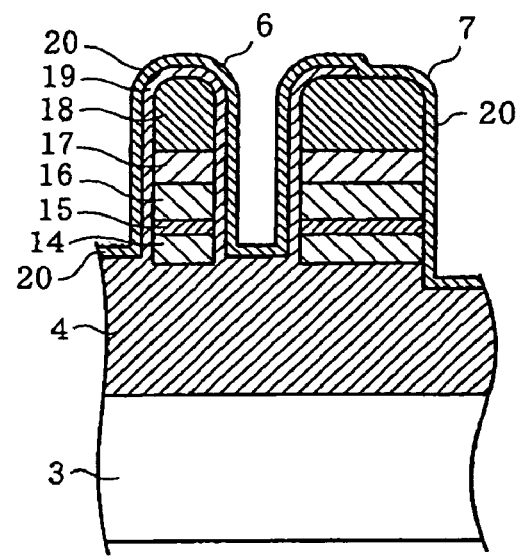
Figure 6C:
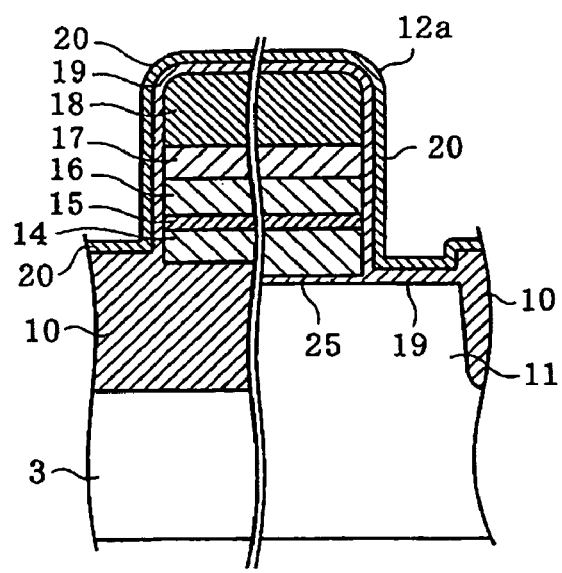
Figure 6D:
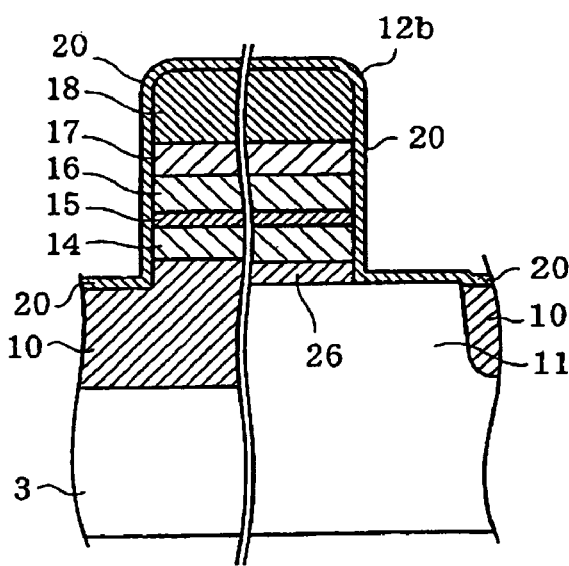
Figure 8A:
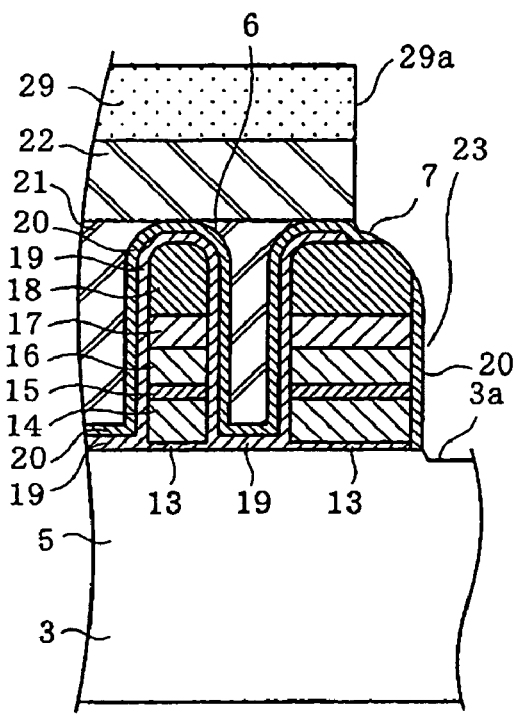
FIGS. 8A to 8D are also views similar to FIGS. 1A to 1D, showing further another middle stage of a fabrication process, respectively.
Figure 8B:
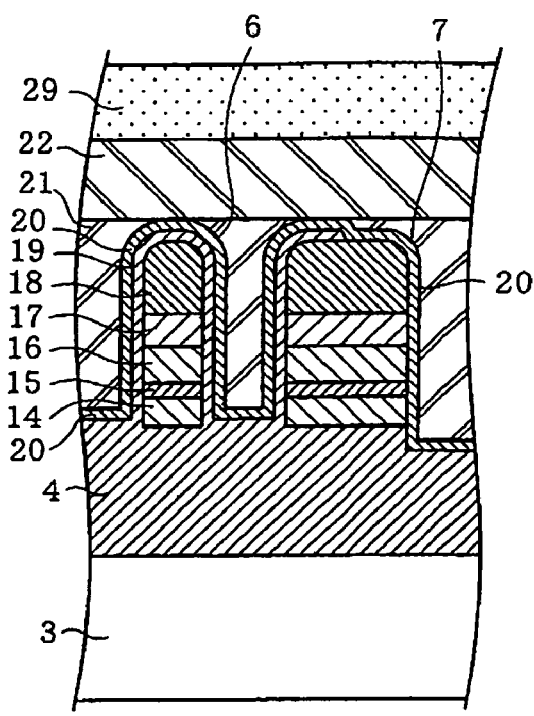
Figure 8C:
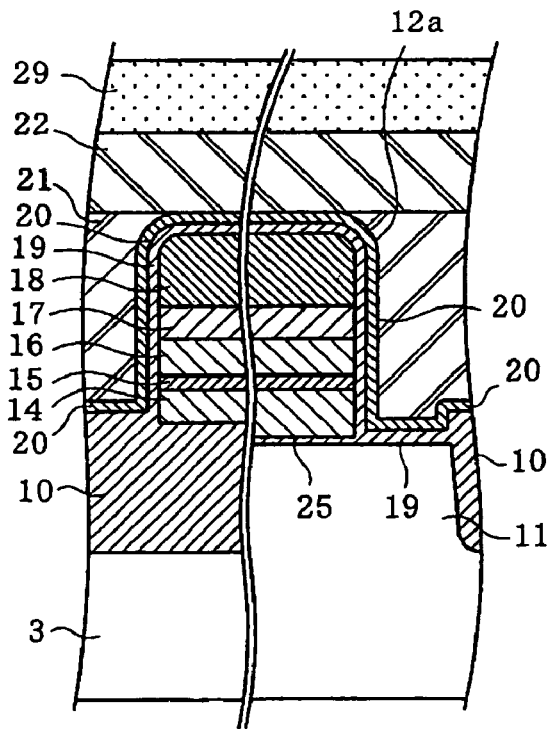
Figure 8D:
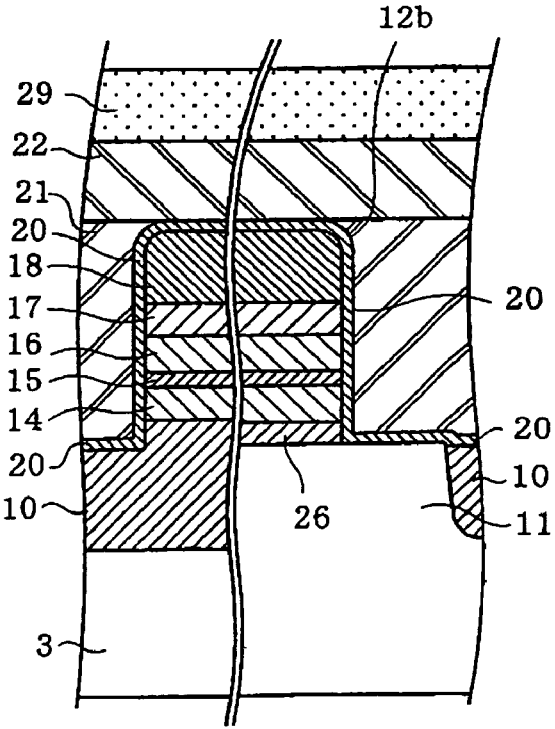
Figure 9A:
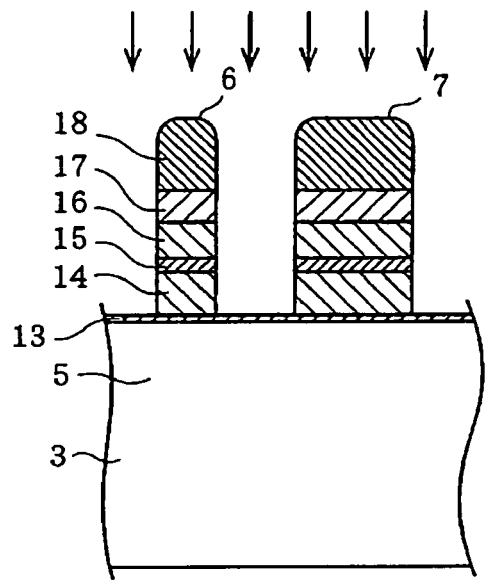
FIGS. 9A to 9D are schematic sectional views of a semiconductor device of a second embodiment of the invention.
Figure 9B:
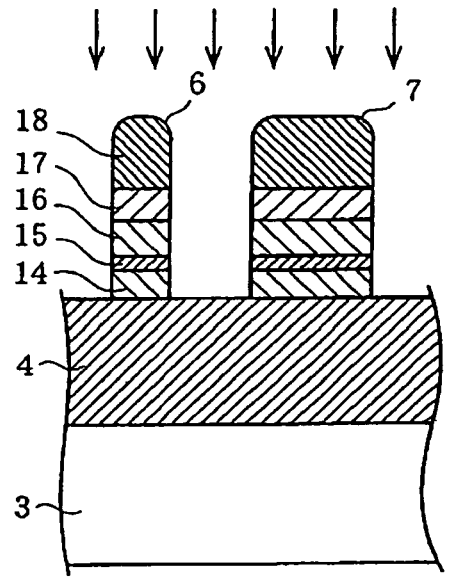
Figure 9C:
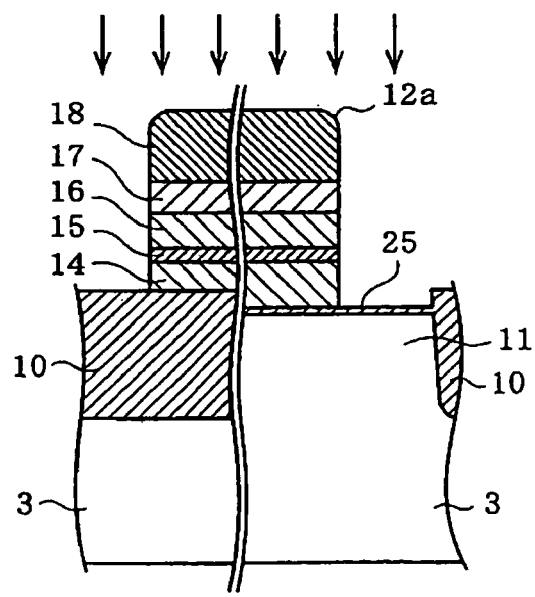
Figure 9D:
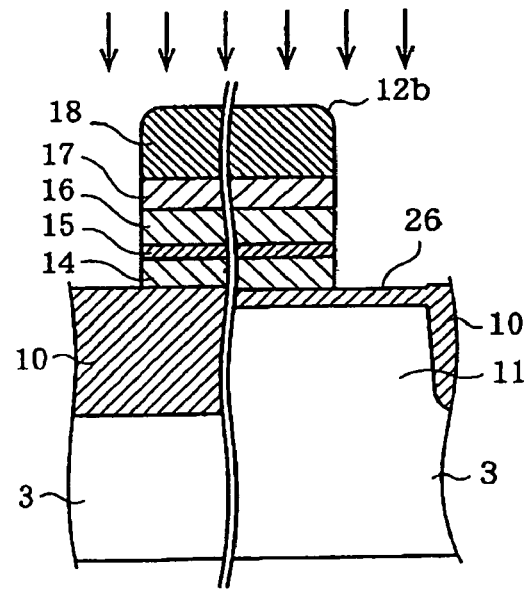

FIGS. 1C and 1D are sectional views taken along lines 1C-1C and 1D-1D in FIG. 2B respectively. The low- and high-voltage transistors 8 and 9 are formed so as to have different film thicknesses of the gate insulating films depending upon different drive voltages as will be described later.

The sectional structure will now be described with reference to FIGS. 1A to 1D. The gate electrodes 6 and 7 of the transistors 1 and 2 are formed via a silicon oxide film 13 on the silicon substrate 3. The silicon oxide film 13 has a film thickness of 8 nm. Each of the gate electrodes 6 and 7 includes a polycrystalline silicon film 14 serving as a floating gate, an oxide-nitride-oxide (ONO) film 15 serving as the gate insulation film, a polycrystalline silicon film 16 serving as a control gate, a tungsten-silicon (WSi) film 17 and a nitride silicon film 18 stacked sequentially from a lower layer.

Furthermore, a thin silicon oxide film is formed by thermal oxidation so as to cover the gate electrodes 6 and 7, and a silicon oxide film 19 such as low-pressure tetraethyl orthosilicate (LP-TEOS) or the like is formed for securement of reliability. In the gate electrode 7 of the selective gate transistor, the silicon oxide film 19 is removed away from a central upper surface of the gate electrode 7 to a central upper surface of an adjacent gate electrode 7 in order that a self-aligned contact may be formed. Furthermore, with removal of the silicon oxide film 19, the surface of the silicon substrate 13 is slightly etched such that a recess 3a is formed.

A thin silicon oxide film due to thermal oxidation remains on the etched surface of the silicon oxide film 19. A silicon nitride film 20 serving as a barrier is formed on the aforesaid upper surface. The silicon nitride film 20 has a function of a stopper both in an etching process and in chemical mechanical polishing (CMP) as will be described later. A boro-phospho silicate glass (BPSG) 21 is formed so as to fill a recess between the gate electrodes 6 and 7. The BPSG film 21 is formed at the level of upper surfaces of the gate electrodes 6 and 7 by the CMP process with the silicon nitride film 20 serving as a stopper as will be described later. The TEOS film 22 is formed on the upper surface of the BPSG film 21.

Contact holes 23 of bit line contact are formed in the TEOS film and the BPSG film 21 located between two gate electrodes 7 by the self-alignment manner respectively. For this purpose, the TEOS and BPSG films 22 and 21 are etched by a reactive ion etching (RIE), and the silicon nitride film 20 is formed as an etching stopper as described above. In this case, the silicon nitride film 20 is partly excessively etched for limitation in the selection ratio of etching. A polycrystalline silicon plug 24 is buried in the bit line contact hole 23.

On the other hand, gate electrodes 6 and 7 which are similar to the above-described are formed on the STI 4 of the memory cell region as shown in FIG. 1B, which is taken along line 1B-1B as described above. The position corresponds to a part excluding a region S where the polycrystalline silicon film 17 serving as the floating gate is divided.

Furthermore, in the etching process for removing the silicon oxide film 19 for formation of the self-aligned contact, the surface of the STI 4 exposed during the etching is also etched, so that the recess 4a is formed to be lower by Δh than the former surface. The polycrystalline silicon film 14 serving as the floating gate includes a part which is located on the STI 4 and formed to be thinner than another part thereof located on the silicon substrate 3. The aforesaid bit line contact hole 23 is not formed on the STI 4.

The arrangement of the low-voltage drive transistors 8 and high-voltage drive transistors 9 as shown in FIGS. 1C and 1D will now be described. The gate electrodes 12a and 12b are formed with silicon oxide films 25 and 26 serving as gate insulating films being formed on the silicon substrate 3. The gate electrodes 12a and 12b have the same film stacked structure as the gate electrodes 6 and 7 respectively. In this regard, the silicon oxide film 25 corresponding to the low-voltage drive transistor 8 has a film thickness of 8 nm, which value is equal to the film thickness of the silicon oxide film 13 of the memory cell transistor 1. The silicon oxide film 26 corresponding to the high-voltage drive transistor 9 has a film thickness of 40 nm.

A thin silicon oxide film is formed by thermal oxidation on the upper surfaces of the gate electrodes 12a so as to cover the upper surfaces. The silicon oxide film 19 such as LP-TEOS or the like is formed for securement of reliability. The silicon oxide film 19 has been removed from the gate electrode 12a of the high-voltage drive transistor 9 for execution of an ion implantation process after formation of the silicon oxide film 19. The STI 10 also has a difference Δh as in the arrangement of the memory cell region. A diffusion layer is formed by an ion implantation process in the active area 11 from which the silicon oxide film 19 has been removed.

A silicon nitride film 21 is formed on the surfaces of the gate electrode 12b and the silicon substrate 3, from which surfaces the silicon oxide film 19 has been removed. Furthermore, The BPSG films 21 are formed so as to bury the recesses of the gate electrodes 12a and 12b, and the TEOS film 22 is formed. Differing from the memory cell region, the peripheral circuit region has a contact hole which is formed after the bit line contact hole 23 and is not shown.

Film thicknesses of layers composing the gate electrodes 6, 7, 12a and 12b are set as follows. The polycrystalline silicon film 13 serving as the floating gate has a film thickness of about 100 nm on the active area 5 or 11 and a film thickness of about 60 nm on the STI 4 or 10. The ONO film 13 has a three-layer structure including an oxide film, a nitride film and an oxide film. The polycrystalline silicon film 15 serving as a control gate has a film thickness of about 80 nm. The WSi film 16 has a film thickness of about 70 nm. The nitride silicon film 17 has a film thickness of about 200 nm at the film formation and a film thickness of about 150 nm after processing.

The fabrication process of the foregoing arrangement will be described with reference to FIGS. 3A to 8D. FIGS. 3A to 3D are sectional views showing the condition immediately after the stacked films have been etched. In this state, regarding the memory cell transistor 6 and the selective gate transistor 7, the gate electrodes 6 and 7 are formed via the gate oxide film 13 on the silicon substrate 3 or on the STI 4 further formed on the silicon substrate 3, as shown in FIGS. 3A and 3B.

Furthermore, regarding the low- and high-voltage drive transistors 8 and 9 of the peripheral circuit region, too, the gate electrodes 12a and 12b are formed via the respective gate oxide films 25 and 26 or on the STI 10 further formed on the silicon substrate 3, as shown in FIGS. 3C and 3D. Subsequently, a thermal treatment is carried out in an atmosphere of oxygen so that thin silicon oxide films are formed on the end surfaces of the gate electrodes 6, 7, 12a and 12b (not shown). Further are formed the diffusion regions of the memory cell transistor 1 and selective gate transistor 2 of the memory cell region and the low- and high-voltage drive transistors 8 and 9 of the peripheral circuit region. In this regard, in the step of forming the diffusion layer, masks according to the respective patterns are used to open the photoresist, and ion implantation is carried out with the patterned photoresist serving as a mask. The resist is then removed by an ordinary resist removing technique, and then the diffusion layer is formed.

Subsequently, as shown in FIGS. 4A to 4D, for improvement in the reliability of the memory cell transistor, the silicon oxide film 19 such as LP-TEOS is formed around the gate electrodes 6 and 7. Thereafter, in order that the silicon oxide films 19 and 26 may selectively be etched back, the photoresist between the gate electrodes 7 and the photoresist of the high-voltage drive transistor 9 are opened by the photolithography process so that the resist pattern 27 is formed.

The silicon oxide film 19 is removed from the contact hole forming region of the selective gate transistor 2 with the opened resist pattern 27 serving as a mask. Furthermore, the silicon oxide film 26 of the high-voltage drive transistor 9 is etched until the silicon substrate 3 is exposed. In this case, the low-voltage drive transistor 8 having the thinner gate insulating film or silicon oxide film 26 is covered by the resist pattern 27. However, it may be exposed.

Subsequently, in order that the silicon oxide film 19 remaining on the sidewall of the gate electrode 7 of the selective gate transistor 2 may be removed, the silicon oxide film 19 is etched back using a liquid chemical containing hydrofluoric acid and successively, the resist pattern 27 is removed using an ordinary resist removing technique.

Subsequently, as shown in FIGS. 5A to 5D, a thermal treatment is carried out in the atmosphere of oxygen after removal of the resist pattern 27 so that a silicon oxide film is formed on the sidewall of the gate electrode 7 of the selective gate transistor 2. The step of forming the diffusion layer may be carried out after the thermal treatment. In this case, too, diffusion layers of various transistors are prepared as described above. For example, when the diffusion layer is formed for the high-voltage drive transistor 9 having the silicon oxide film 26 corresponding to the thick gate insulating film, a part of the transistor 9 having the thick silicon oxide film 26 is opened using a resist pattern 28 and the ion implantation process is carried out.

Thereafter, as shown in FIGS. 6A to 6D, the resist pattern 28 is removed and the silicon nitride film 20 is formed on the whole surface. The silicon nitride film 20 serves as a stopper in each of the CMP process and the etching in the formation of the contact hole. Next, thick BPSG films 21 are formed so as to fill gaps between the gate electrodes 6, 7, 12a and 12b and thereafter, the silicon nitride film 20 is flattened by the CNP process so as to serve as a stopper. Furthermore, the TEOS film 22 is formed so that the configuration as shown in FIGS. 7A to 7D is obtained. The BPSG film 21 and TEOS film 22 both serve as interlayer insulating films.

Subsequently, as shown in FIGS. 8A to 8D, the bit line contact hole 23 is formed. The resist pattern 29 for forming a contact hole is formed by the photolithography process. The TEOS film 22 and BPSG film 21 are etched by a reactive ion etching (RIE) process. The silicon nitride film 20 formed in a lower layer of the BPSG film 21 serves as a stopper. Successively, the silicon nitride film 20 is etched so that a surface part 3a of the silicon substrate is exposed. In this case, a part formed on an upper part of the gate electrode 7 is etched so that the upper part of the gate electrode is rounded.

The aforesaid resist pattern 29 is removed and the polycrystalline silicon plug 24 is formed in the bit line contact hole 23 as shown in FIGS. 1A and 1B. In this regard, firstly, the polycrystalline silicon film is formed on the whole surface and thereafter, an etch-back process is carried out so that the polycrystalline silicon plug 24 having a predetermined height in the bit line contact hole 23. As a subsequent step, a groove is formed by a damascene technique and tungsten wiring is formed in the groove and so that the tungsten plug is buried by the CMP method.

In the foregoing embodiment, the high-voltage drive transistor 9 is provided with the silicon oxide film 21 corresponding to a thick gate insulating film. The etching process carried out for formation of the STI 10 of the high-voltage drive transistor 9 is combined with the etching process for the silicon oxide film 19 for the purpose of improvement in the cell reliability. Accordingly, the etching process for the formation of the STI 10 can be carried out without damaging the surface of the active area 5 of the memory cell transistor 1 and without addition of a photolithography process. Consequently, the number of steps in the fabrication process can be reduced and a cost reduction can be achieved.

FIGS. 9A to 9D illustrate a second embodiment of the invention. In the second embodiment, the formation of the diffusion layer of the memory cell transistor 1 is executed at the stage as shown in FIGS. 3A to 3D, so that no photolithography process is employed. More specifically, ion implantation is selectively carried out by making use of a difference in the film thickness between the silicon oxide films 13, 25 and 26 serving as the gate insulating films. In the embodiment, the silicon oxide film 26 is thick whereas the silicon oxide films 13 and 25 are thin. The ion energy at the time of ion implantation is suitably selected so that only the active areas 5 and 11 of the silicon oxide films 13 and 25 are doped with ions serving as impurities and the silicon oxide film 26 is prevented from being doped with ions.

More specifically, the gate electrodes 6, 7, 12a and 12b are formed in the same manner as described above. The thermal treatment is carried out in the atmosphere of oxygen so that a configuration as shown in FIGS. 9A to 9D, which is similar to the state as shown in FIGS. 3A to 3D. Successively, the active area 5 of the memory cell transistor 1 and the active area 11 of the low-voltage drive transistor 8 are selectively doped with ions. In this case, a photolithography technique is conventionally employed so that only the cell is selectively opened for ion implantation. In the embodiment, however, ion implantation is applied to the entire surface without use of photoresist. In this case, the silicon oxide film 26 formed into a thick gate insulating film serves as a stopper in the high-voltage drive transistor 9. As a result, transistor characteristics can be prevented from being adversely affected by the ions.

Figure 10A:
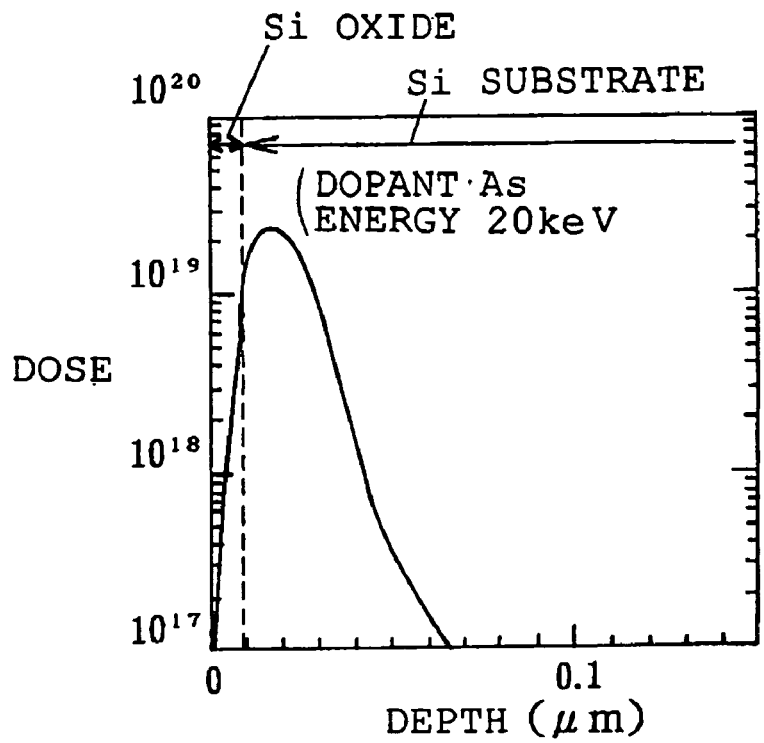
FIGS. 10A and 10B are graphs showing the relationship between a film thickness of the silicon oxide film and ion implantation.
Figure 10B:
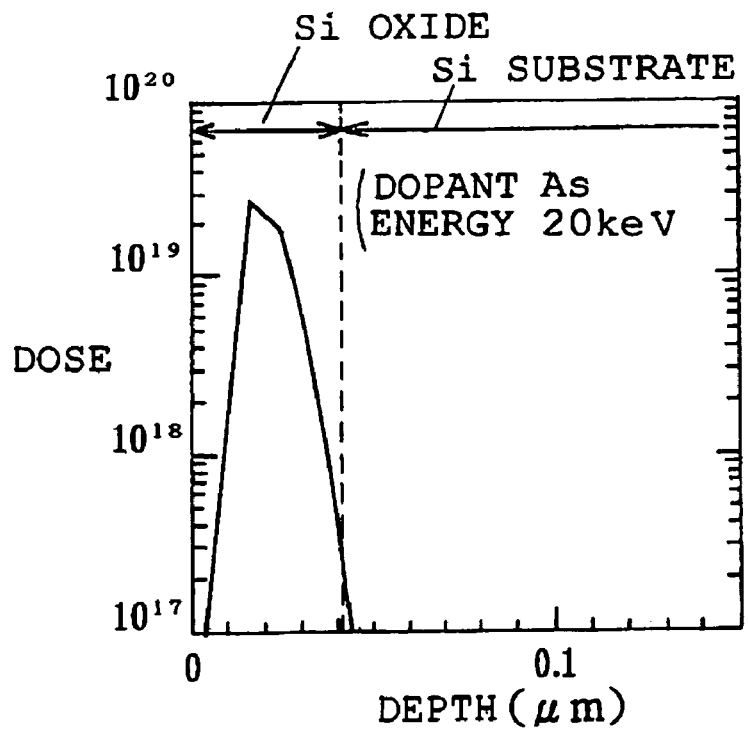

The inventors confirmed the foregoing by simulation. FIGS. 10A and 10B show the results of the simulation. In a case where the ion energy of arsenic ion As is 20 keV, for example, FIG. 10A shows the case where the silicon oxide film is not more than 10 nm and is thin, that is, the case of the thin silicon oxide films 13 and 25. Since the dose has a peak located within the silicon substrate, almost all the introduced ion reaches the inside of the silicon substrate.

FIG. 10B shows the case where the silicon oxide film is thick and has a thickness of 40 nm, that is, the case of the thick silicon oxide film 26. Since the dose has a peak located in the silicon oxide film, almost all the introduced ion is cut off without reaching the silicon substrate.

Steps subsequent to the above-described step are the same as those in the first embodiment and accordingly, the description of the subsequent steps will be eliminated.

In the second embodiment, the diffusion layer is selectively formed by ion implantation by making use of the difference in the film thickness between the silicon oxide films 13, 25 and 26. Consequently, since the number of times of the photolithography process is reduced, the number of steps in the fabrication process can be reduced and a cost reduction can be achieved.

The flash memory in each of the above-described embodiments may be of a BAND type or a NOR type.

The foregoing description and drawings are merely illustrative of the principles of the present invention and are not to be construed in a limiting sense. Various changes and modifications will become apparent to those of ordinary skill in the art. All such changes and modifications are seen to fall within the scope of the invention as defined by the appended claims.

What is claimed is:

1. A method of fabricating a semiconductor device, comprising:
   forming on a semiconductor substrate a gate electrode with a gate insulating film being interposed therebetween;
   forming an insulating film for element isolation protruding from a surface of the semiconductor substrate;
   forming an oxide film on the surface of the semiconductor substrate with the gate electrode and the element isolation insulating film having been formed;
   removing the oxide film in a region in which a self-aligned contact hole is to be formed while using a resist pattern for removing the oxide film formed in a region in which the self-aligned contact hole is formed; and
   etching a part of the element isolation insulating film protruding from the surface of the semiconductor substrate so that said part is substantially on a level with the surface of the semiconductor substrate, while using the resist pattern for removing the oxide film formed in the region in which the self-aligned contact hole is formed.

2. A method of fabricating a semiconductor device, comprising:
   forming on a semiconductor substrate a plurality of gate insulating films having different film thicknesses;
   forming a plurality of gate electrodes on the gate insulating films respectively;
   forming an insulating film for element isolation protruding from a surface of the semiconductor substrate;
   forming an oxide film on an entire surface of the semiconductor substrate with the gate insulating films, the gate electrodes and the element isolation insulating film having been formed;
   opening a forming region for a self-aligned contact hole, exposing thicker gate insulating films around the gate electrodes and a surface of the element isolation insulating film, and forming a resist pattern which is shaped so as to cover regions around the gate electrodes;
   removing the oxide film of the region in which the contact hole is to be formed with the resist pattern serving as a mask, and etching a part of the element isolation insulating film protruding from the surface of the semiconductor substrate so that said part is substantially on a level with the surface of the semiconductor substrate.

3. The method according to claim 2, further comprising ion-implanting impurities through the thinner gate insulating films onto the surface layer of the semiconductor substrate around the gate electrodes formed with the thinner gate insulating films through the use of a difference in thicknesses of the gate insulating films prior to the resist pattern forming step.

* * * * *